United States Patent [19]

Stoisiek

[11] Patent Number: 4,942,443
[45] Date of Patent: Jul. 17, 1990

[54] THYRISTOR WITH AUXILIARY EMITTER ELECTRODE AND SHORT-CIRCUIT REGIONS AND METHOD

[75] Inventor: Michael Stoisiek, Ottobrunn, Fed. Rep. of Germany

[73] Assignee: Siemens Aktiengesellschaft, Berlin and Munich, Fed. Rep. of Germany

[21] Appl. No.: 370,495

[22] Filed: Apr. 21, 1982

[30] Foreign Application Priority Data

May 8, 1981 [DE] Fed. Rep. of Germany ....... 3118317

[51] Int. Cl.[5] ............................................. H01L 29/74
[52] U.S. Cl. .................................. 357/38; 357/23.12; 357/43; 357/86
[58] Field of Search ................. 357/23, 38, 86, 23.12, 357/43

[56] References Cited

U.S. PATENT DOCUMENTS 4,224,634  9/1980  Suedberg ............................ 357/38

Primary Examiner—Joseph E. Clawson, Jr.
Attorney, Agent, or Firm—Hill, Van Santen, Steadman & Simpson

[57] ABSTRACT

A power thyristor with internal current amplification has an auxilary emitter region which is contacted by an auxiliary emitter electrode. Disconnectible current paths designed as MIS structures are provided between the auxiliary emitter electrode and the base layer adjacent to the auxiliary emitter region. The current paths, which effect a stabilization in their switched-on state, are switched off for the duration of the ignition operation in order to increase the trigger sensitivity. Each MIS structure exhibits a short-circuit region inserted into the adjacent base layer spaced from the auxiliary emitter region, said short-circuit region being connected to the adjacent base layer over a conductive coating.

6 Claims, 2 Drawing Sheets

THYRISTOR WITH AUXILIARY EMITTER ELECTRODE AND SHORT-CIRCUIT REGIONS AND METHOD

BACKGROUND OF THE INVENTION

1. Field of the Invention

The present invention relates to a thyristor and more particularly to a thyristor with an auxiliary emitter.

2. The Prior Art

The thyristor described in Patalong application U.S. Ser. No. 199,520 employs an auxiliary emitter with an auxiliary emitter electrode for the purpose of providing internal trigger amplification. The stability of the thyristor, i.e., its security against unintentional trigger operations caused by large voltages applied in the forward conducting direction, is increased by means of at least one disconnectible circuit path designed as an MIS structure which connects the auxiliary emitter by a low resistance path to the base layer adjacent thereto. In addition, the emitter of the thyristor is provided with a plurality of fixed emitter short-circuits. The MIS structure has a control terminal to which a control voltage pulse is supplied which shuts off the current path for the duration of the trigger ooperation.

Thyristors with n- or p-emitters and which are provided with controllable emitter short-circuits are known from the U.S. Pat. No. 3,243,669 (for example, FIG. 9) and from the German Patent No. 23 25 917. In these thrysitors, disconnectible current paths are provided in the form of MIS structures which are turned on only for the purpose of rapid quenching of the thyristors. The quenching current paths are formed with a first semiconductor region of a first conductivity type at the edge of the n(p)-emitter, with a second semiconductor region of the same conductivity type inserted into the base layer adjacent in the n(p)-emitter at a distance therefrom, and a subregion of the base layer lying between the semiconductor regions and exhibiting a second conductivity type and covered by an insulated gate. The German patent referred to above also describes the engaging of current paths during the occurrence of an ignition pulse in order to prevent an ignition.

None of the previously known thyristor designs, however, provide an arrangement in which current paths allocated to an auxiliary emitter are switched on before the ignition of a thyristor in order to stabilize a thyristor, and are switched off during the trigger operation.

BRIEF DESCRIPTION OF THE INVENTION

A principal object of the present invention is to provide a simple and easily manufactured thyristor having superior operational characteristics.

This object is achieved in the present invention by manufacturing the short-circuit regions required for the disconnectible current paths within the framework of those doping steps which are already required for manufacturing the individual semiconductor regions of the thyristor, so that the added complexity and expense for the disconnectible current path can be kept very low.

These and other objects and advantages of the present invention will become manifest by an examination of the following description and accompanying drawings.

BRIEF DESCRIPTION OF THE DRAWINGS

Reference will now be mae to the accompanying drawings in which.

DESCRIPTION OF THE PREFERRED EMBODIMENTS

Figure 1:
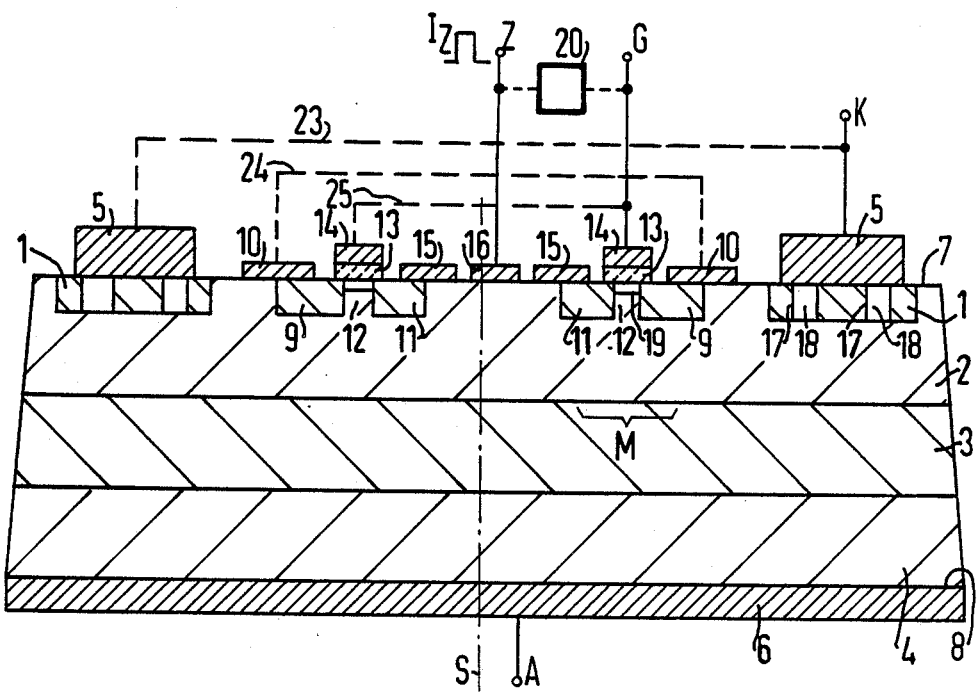
FIG. 1 is a cross-sectional view of an illustrative embodiment of the present invention.

The thyristor illustread in FIG. 1 exhibits a semiconductor body consisting of doped semiconductor material, for example, silicon, which is dynamically balanced relative to an axis S and which comprises four successive layers of alternating conductivity type. In FIG. 1, a n-conductive layer 1 is referred to as the n-emitter, a p-conductive layer 2 is referred to as the p-base layer, a n-conductive layer 3 is referred to as the n-base layer, and a p-conductive layer 4 is referred to as the p-emitter. The n-emitter 1 is provided at the boundary surface 7 of the semiconductor body with a cathode 5 consisting of electrically conductive material, for example, aluminum, which, just like the n-emitter, is designed in the manner of an annular ring. At the opposite boundary surface 8 of the semiconductor body, the p-emitter 4 is occupied with an anode 6 consisting of electrically conductive material, for example, aluminum. The cathode 5 is connected to a terminal K, whereas the anode 6 is provided with a terminal A.

An annular ring-shaped, n-conductive semiconductor region 9 which extends up to the boundary surface 7, is inserted into the p-base layer 2. It is referred to as the auxiliary emitter region. In the boundary surface 7, it is contacted by an annular ring-shaped auxiliary emitter electrode 10 consisting of electrically conductive material which is extended in the direction toward the n-emitter 1 to such degree that it bridges the pn-junction at the outer edge of the auxiliary emitter region 9 with a low-resistance path relative to the p-base layer 2.

A likewise annular, n-conductive short-circuit region 11, which extends up to the boundary surface 7, is inserted into the p-base layer 2. It is disposed concentrically relative to the auxiliary emitter region 9 and is spaced therefrom in radial direction a distance which is determined by the width of a subregion 12 of the p-base layer 2. The subregion 12 is covered by a thin, electrically insulating layer 13 disposed on the boundary surface 7. A gate 14 is disposed on the layer 13 which gate is connected t a control terminal G. The gate 14 consist of electrically conductive material, for example, consists of highly doped polycrystalline silicon or of metal, particularly, aluminum. At its edge facing away from the auxiliary emitter region 9, the short-circuit region 11 is contacted by a conductive coating 15 which is extended to such degree in the direction toward the axis of symmetry S that the pn-junction between the parts 11 and 2 is bridged by a low-resistance at this location. A central part of the p-base layer 2 is occupied with an ignition electrode which is connected to a terminal Z for an ignition circuit.

The n-emitter 1 exhibits recesses 17 which are filled out by projections 18 of the p-base layer 2. The projections 18 extend up the boundary surface 7 of the semiconductor body and are contacted by the cathode 5.

The inner edge area of the auxiliary emitter region 9 represents a first n-conductive semiconductor region and the short-circuit region 11 represents a second n-conductive semiconductor region of a MIS structure M to which, further, the p-conductive subregion 12, the insulating layer 13 and the gate 14 belong. When the MIS structure is of the depletion type, then, given a voltage-free gate 14, a n-conductive channel 19 exists at the boundary surface 7 below the gate 14, which n-conductive channel 19 connects the semiconductor regions 9 and 11 to one another with low resistance. In detail, the channel 19 consists either of an inversion layer which has been formed under the influence of an electrical field existing at the boundary surface 7, or consists of an n-conductive channel region which is introduced into the subregion 12 directly at the boundary surface 7 by means of an additional n-doping. From the auxiliary emitter region 9, a current path proceeds over the channel 19, the short-circuit region 11, and the conductive coating 15 to the p-base layer 2. Given application of a negative voltage to the control terminal G, the channel 19 is eliminated or switched to a high resistance path, and the current path described above is thus interrupted.

Before the ignition of the thyristor, the channel 19 is switched on. If a blocking voltage thereby lies at the terminals A and K, then the hole electrons thermally generated in the base layers, which move toward the auxiliary emitter region 9 and the n-emitter 1 under the influence of this voltage, do not for their majority reach the pn-junctions at the boundary surfaces of said regions but, rather, are diverted over the current path 15, 11 and 19 into the region 9 and over the projections 18 to the cathode 5. As a result thereof, an electron emission from the regions 9 and 1 into the base layers which could initiate an undesired ignition of the thyristor is avoided. Thus, because of the current path 15, 11 and 19 which has been switched on, the thyristor is trigger-insensitive or, respectively, stable.

The ignition of the thyristor is accomplished by means of an ignition current pulse $I_z$ supplied to the terminal Z. At the same time, a control of its trigger sensitivity is provided by a signal at the control terminal G, illustrated in FIG. 2. At the ignition t1 (FIG. 2), G is charged with a negative pulse P1 of, for example, $-5$ volts, which voltage effects a disconnection of the channel 19. The hole electrons injected into the p-base layer 2 over the ignition electrode 16 then effect an electron emission from the auxiliary emitter region 9 into the base layers 2 and 3, by means of which an ignition of the thyristor is initiated in the area of the auxiliary emitter 9. The thyristor current at first flowing through 9 is diverted over the auxiliary emitter electrode 10 toward the n-emitter 1, and effects a rapid and large-surface ignition in the area of the latter. If one assumes that the thyristor has triggered at time t2 in the area of the n-emitter 1, the pulse P1 can be disconnected from G at this time. The thyristor is again quenched in the area of the auxiliary emitter region 9, whereby the overall load current is picked up by that part of the thyristor cross-section which contains the n-emitter 1. Quenching of the thyristor in the area of the n-emitter 1 is accomplished when the load current flowing through A and K falls below a holding value. This is the case when the voltage adjacent to A and K, and poled in the conducting direction, is disconnected or, when an alternating voltage is applied to the thyristor, it occurs given the next zero passage of said alternating voltage.

In an alternative embodiment, the MIS structure M can be designed as a MIS structure of the enhancment type. In this case, a positive voltage must be supplied to the control terminal G in order to generate and maintain an inversion channel 19. When this voltage is interrupted, then the channel 19 is eliminated. The stabilization effect described above due to the current path 15, 11 and 19, which is eliminated during the time interval t1 through t2, can thereby be achieved by means illustrated in FIG. 3. Thereby a control voltage $U_G$ of, for example, $+5$ volts, is supplied, which control voltage being interrupted in the time interval t1 through t2.

Figure 2:
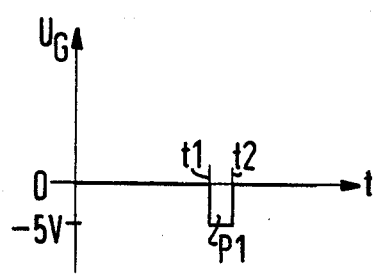
FIGS. 2 and 3 are voltage-time diagrams illustrating operation of the apparatus of FIG. 1.
Figure 3:
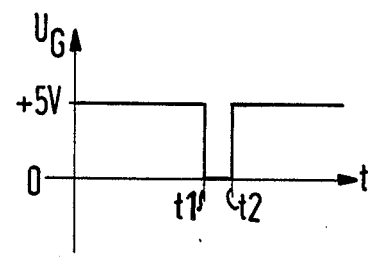
Figure 4:
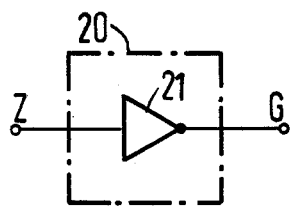
FIGS. 4 and 5 are functional block diagrams illustrating polarity reversing circuits.
Figure 5:
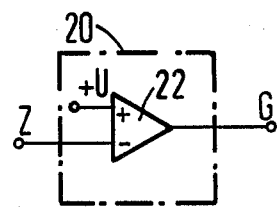

According to a further development of the invention, the control voltages $U_G$ according to FIGS. 2 or 3 can be derived from the ignition voltage occurring at the terminal Z by means of an auxiliary circuit 20 which is connected at its input to Z and is connected at its output to G. Given a drive pulse according to FIG. 2, the auxiliary circuit 20 according to FIG. 4 is designed as an inverter circuit, for example, as an inverting amplifier 21. When a drive according to FIG. 3 is used, a polarity reversal circuit with level shift according to FIG. 5 is employed. This consists of a differential amplifier 22 with its non-inverting input wire to a voltage $+U$ which corresponds to the magnitude of the ignition voltage occurring at Z, and its inverting input wired to Z, and its output wired to G.

Figure 6:
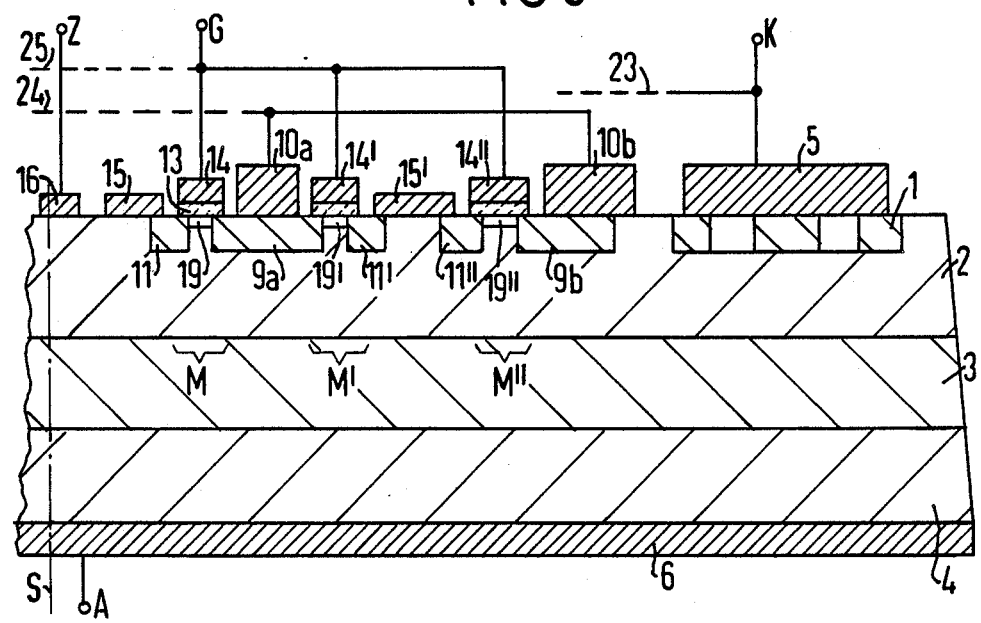
FIG. 6 is a second illustrative embodiment of the present invention.

FIG. 6 shows a second illustrative embodiment of the invention which differs from FIG. 1 in that a plurality of disconnectible current paths are allocated to the auxiliary emitter region. For the purpose, two auxiliary emitter subregions 9a and 9b are provided which are respectively contacted by parts 10a and 10b of the auxiliary emitter electrode. The part 10a, thereby does not project over the edge of the subregion 9a, whereas the part 10b does project over the edge of 9b in the direction toward the n-emiter 1, so that the pn-junction between the parts 9b and 2 is bridged by a low resistance at this location. The MIS structure M already described in connection with FIG. 1, is disposed at the left-hand side edge of 9a, its parts being referenced with the same reference numerals as in FIG. 1. A corresponding MIS structure M' is situated at the right edge of 9a and a further structure of the same type which is referenced with M" is situated at the left edge of 9b. Gates 14' and 14" belonging to these structures are conducted together with the gate 14 to a common control terminal G. The short-circuit regions 11' and 11" of the structures M' and M" are contacted by a common, conductive coating 15' which bridges their mutually facing pn-junctions with a low resistance relative to the p-base layer 2. The remaining circuit parts of FIG. 6 correspond to the circuit parts of FIG. 1 which are referenced with the same reference characters.

The thyristor according to FIG. 6 is operated in the same manner as that according to FIG. 1 with the difference that, in addition to a n-channel 19, further n-channels 19' and 19" are simultaneously switched on. Thus, in the blocked state of the thyristor, respectively, three current paths between the auxiliary emitter subregions 9a and 9b and the p-base layer 2 exist, so that a greater stabilization effect is achieved than given the thyristor according to FIG. 1. In the time interval from t1 through t2, the current paths proceeding over the channels 19, 19' and 19" are switched off in order to increase the trigger sensitivity.

The thyrsitor according to FIG. 6 advantageously has a dynamically balanced format relative to an axis of axial symmetry S, whereby the illustrated sub-structure are respectively designed as annular rings.

According to a further embodiment of the invention, all of the sub-structures illustrated in FIGS. 1 and 6, with the exception of the base layers 2 and 3 and of the p-emitter 4, can also be designed in the form of elongated strips disposed perpendicularly to the planes of the drawings in FIGS. 1 and 6. These sub-structures expediently extend over the entire thyristor cross-section. With this arrangement, connecting lines 23 through 25, indicated with broken lines, must be provided between corresponding parts of FIG. 1 provided with the identical references. These connecting lines are also indicated with broken lines in FIG. 6.

The conductive coating 15 and trigger electrode 16 can be advantageously designed as a common coating. Alternatively, the coating 15 is connected the terminal Z, in which case the electrode 16 may be eliminated.

Within the framwork of the invention, a p-conductive auxiliary emitter region can also be provided, being inserted in the n-base layer at a distance from p-emitter and being provided with disconnectible current p of the type described above. FIGS. 1 and 6 can serve for the explanation of this circuit alternative when the of the terminals A and K are interchanged, the individual semiconductor parts respectively exhibit the opposite conductivities, and the currents and voltages are supplied with respectively reversed polarities.

The penetration depth of the semiconductor regions 1, 9, 9a, 9b, 11, 11' and 11" into the layer 2 can, for example, amount to 3 μm. Then, a spacing o t short-circuit region 11 from the auxiliary emitter region 9 of, for example 5 μm is prefered. The lateral dimensions of short-circuit regions 11, 11' and 11" in the figure planes of FIGS. 1 and 6 can, for example, respectively amount to 10 μm. The semiconductor body of the thyristor according to FIGS. 1 or 6 exhibits the form of a thin, particularly round disk with a thickness of, for example, 200 μm through 1 mm.

It will be apparent to those skilled in the art that various modifications and additions may be made in the apparatus and method described above, without departing from the essential features of novelty thereof, which are intended to be defined and secured by the appended claims.

What is claimed is:

1. A thyristor with a semiconductor body having an n-emitter contacted by a cathode with an adjacent p-base layer, a p-emitter contacted by the anode with an adjacent n-base layer, and an auxiliary emitter region with an auxiliary emitter electrode, at least one disconnectible current path designed as a MIS structure provided at the boundary surface of the semiconductor body carrying the auxiliary emitter electrode, said disconnectible current path comprising a semiconductor region of a first conductivity type connected to the adjacent base layer, a second semiconductor region of the first conductivity type connected to the auxiliary emitter electrode, and a semiconductor region of a second conductivity type lying between said semiconductor regions, said semiconductor region of said second conductivity type being covered by a gate having a control terminal and electrically insulated from the semiconductor body, one of said emitters having a plurality of fixed emitter short-circuits, the first semiconductor region of said disconnectible current path including an edge area of the auxiliary emitter region, the said second semiconductor region including a short-circuit region which is inserted into the base layer adjacent to the auxiliary emitter region and connected to said base layer over a conductive coating, and said semiconductor region covered by a gate including a sub-region of said base layer.

2. The thyristor according to claim 1, wherein the base layer adjacent to the auxiliary emitter region is provided with a trigger electrode connected to a terminal for an ignition circuit.

3. The thyristor according to claim 1, wherein the auxiliary emitter region is subdivided into auxiliary emitter sub-regions having parts of the auxiliary emitter electrode which are conductively connected to one another; and including disconnectible current paths designed as MIS structures provided at the auxiliary emitter sub-regions.

4. The thyristor according to claim 2, wherein the terminal for the ignition circuit is connected to a control terminal shared by the gates of the MIS structures over a polarity reversing circuit.

5. The thyristor according to claim 1, wherein at least one of the MIS structures is of the depletion type and exhibits a channel region of the first conductivity type inserted into said semiconductor region of said second conductivity type.

6. A method for operating a thyristor according to claim 4, including the steps of supplying an ignition current pulse to said terminal for the ignition circuit, developing a control voltage corresponding the reverse polarity of the voltage present at said terminal for the ignition circuit, and supplying said reverse polarity voltage to said control terminal for interrupting the current paths of the MIS structures for the duration of the trigger pulse.

* * * * *